US009117730B2

(12) United States Patent
Tominaga et al.

(10) Patent No.: US 9,117,730 B2
(45) Date of Patent: Aug. 25, 2015

(54) PRINTED WIRING BOARD AND METHOD FOR MANUFACTURING PRINTED WIRING BOARD

(71) Applicants:Ryojiro Tominaga, Ogaki (JP); Kenji Sakai, Ogaki (JP); Naoaki Fujii, Ogaki (JP)

(72) Inventors: Ryojiro Tominaga, Ogaki (JP); Kenji Sakai, Ogaki (JP); Naoaki Fujii, Ogaki (JP)

(73) Assignee: IBIDEN Co., Ltd., Ogaki-shi (JP)

( * ) Notice: Subject to any disclaimer, the term of this patent is extended or adjusted under 35 U.S.C. 154(b) by 152 days.

(21) Appl. No.: 13/665,473

(22) Filed: Oct. 31, 2012

(65) Prior Publication Data

US 2013/0168134 A1    Jul. 4, 2013

Related U.S. Application Data

(60) Provisional application No. 61/581,321, filed on Dec. 29, 2011.

(51) Int. Cl.
*H05K 1/16* (2006.01)
*H01L 23/15* (2006.01)
*H01L 23/498* (2006.01)
*H05K 3/46* (2006.01)

(52) U.S. Cl.
CPC .......... *H01L 23/15* (2013.01); *H01L 23/49827* (2013.01); *H05K 3/4673* (2013.01); *H01L 2224/16* (2013.01); *H05K 3/4602* (2013.01); *H05K 2201/0195* (2013.01); *H05K 2201/029* (2013.01); *H05K 2201/0209* (2013.01); *Y10T 29/49155* (2015.01)

(58) Field of Classification Search
USPC ......... 174/260, 255, 258, 261, 262, 264, 266; 361/762–764, 794; 156/64, 182; 257/723, 724; 29/830, 832, 834, 841
See application file for complete search history.

(56) References Cited

U.S. PATENT DOCUMENTS

| | | | |
|---|---|---|---|
| 6,998,336 B1* | 2/2006 | Iba et al. | 438/612 |
| 8,169,050 B2* | 5/2012 | Daley et al. | 257/531 |
| 2003/0063453 A1* | 4/2003 | Kusagaya et al. | 361/794 |
| 2004/0134682 A1* | 7/2004 | En et al. | 174/258 |
| 2004/0160751 A1* | 8/2004 | Inagaki et al. | 361/763 |

(Continued)

FOREIGN PATENT DOCUMENTS

| | | |
|---|---|---|
| CN | 1776892 A | 5/2006 |
| JP | 2007-042666 | 2/2007 |

OTHER PUBLICATIONS

U.S. Appl. No. 13/560,239, filed Jul. 27, 2012, Morita, et al.

*Primary Examiner* — Xiaoliang Chen
(74) *Attorney, Agent, or Firm* — Oblon, McClelland, Maier & Neustadt, L.L.P.

(57) ABSTRACT

A printed wiring board includes a core substrate, a first conductive pattern formed on the substrate, an insulation structure having a first insulation layer and formed on the substrate such that the first insulation layer covers the first pattern, a second conductive pattern formed on the structure, and a second insulation layer formed on the structure such that the second insulation layer covers the second pattern. The structure has a via conductor connecting the first and second patterns through the first insulation layer, the first insulation layer includes a first layer containing a reinforcing fiber material and a second layer formed on the first layer such that the first layer is on the substrate side and a second layer is on the second insulation layer side, and the second layer is made of an insulating material which is the same material as an insulating material forming the second insulation layer.

20 Claims, 9 Drawing Sheets

(56) References Cited

U.S. PATENT DOCUMENTS

| | | |
|---|---|---|
| 2005/0006744 A1* | 1/2005 | Ooi et al. .................. 257/686 |
| 2005/0039948 A1* | 2/2005 | Asai et al. .................. 174/262 |
| 2005/0098882 A1* | 5/2005 | Kusagaya et al. ............ 257/734 |
| 2005/0207091 A1* | 9/2005 | Kambe et al. ............. 361/301.1 |
| 2007/0025091 A1 | 2/2007 | Shimada et al. |
| 2007/0258225 A1* | 11/2007 | Inagaki et al. ............... 361/763 |
| 2007/0266886 A1* | 11/2007 | En et al. .................. 106/1.18 |
| 2008/0042258 A1* | 2/2008 | Ooi et al. .................. 257/700 |
| 2008/0142255 A1* | 6/2008 | Inagaki et al. ............... 174/260 |
| 2008/0144298 A1* | 6/2008 | Inagaki et al. ............... 361/763 |
| 2008/0151520 A1* | 6/2008 | Sakamoto et al. ............ 361/764 |
| 2008/0169120 A1* | 7/2008 | Inagaki et al. ............... 174/255 |
| 2008/0277148 A1* | 11/2008 | Asai et al. .................. 174/255 |
| 2008/0292852 A1* | 11/2008 | En et al. .................. 428/209 |
| 2009/0145652 A1* | 6/2009 | En et al. .................. 174/265 |
| 2010/0014261 A1* | 1/2010 | Inagaki et al. ............... 361/763 |
| 2010/0122840 A1* | 5/2010 | Asai et al. .................. 174/258 |
| 2010/0155116 A1* | 6/2010 | Kawai et al. ................ 174/257 |
| 2010/0155933 A1* | 6/2010 | Ooi et al. .................. 257/700 |
| 2010/0226108 A1* | 9/2010 | Inagaki et al. ............... 361/762 |
| 2010/0243299 A1* | 9/2010 | Kariya et al. ............... 174/255 |
| 2010/0328915 A1* | 12/2010 | Inagaki et al. ............... 361/764 |
| 2011/0024172 A1* | 2/2011 | Maruyama et al. .......... 174/258 |
| 2011/0036625 A1* | 2/2011 | Narahashi et al. ........... 174/261 |
| 2011/0253306 A1* | 10/2011 | Asai et al. ................. 156/272.8 |
| 2012/0006469 A1* | 1/2012 | Inagaki et al. ............... 156/182 |
| 2012/0024582 A1* | 2/2012 | Maeda et al. ............... 174/258 |
| 2013/0242520 A1* | 9/2013 | Onozuka .................... 361/783 |

* cited by examiner

FIG. 5
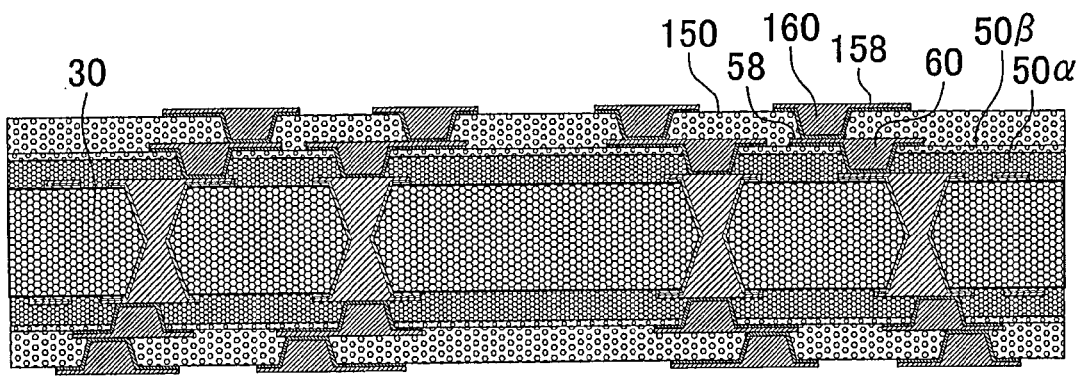
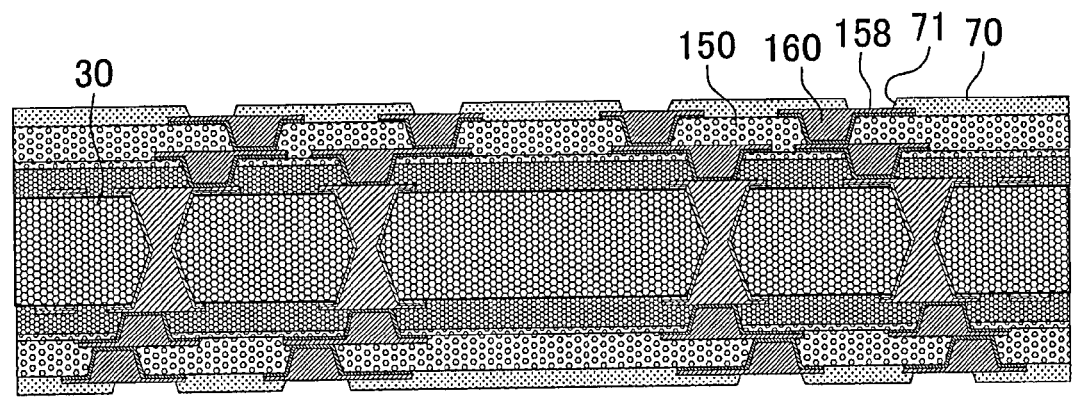
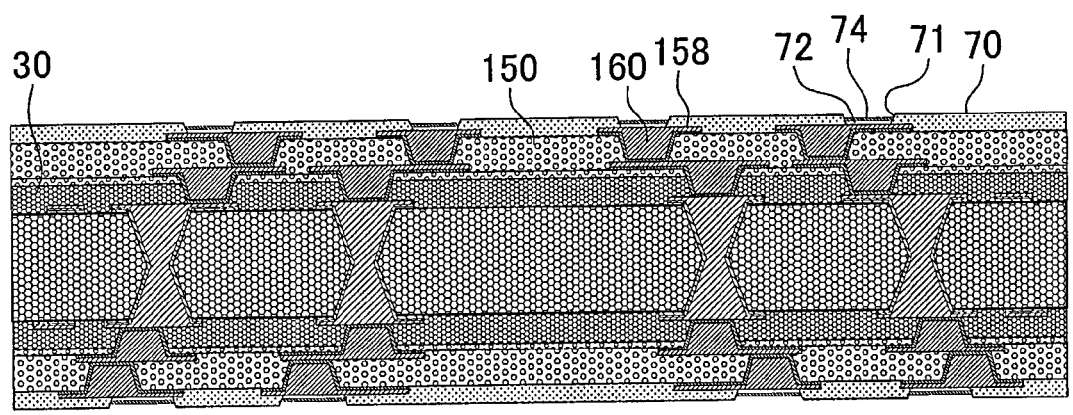

FIG. 8
(A)
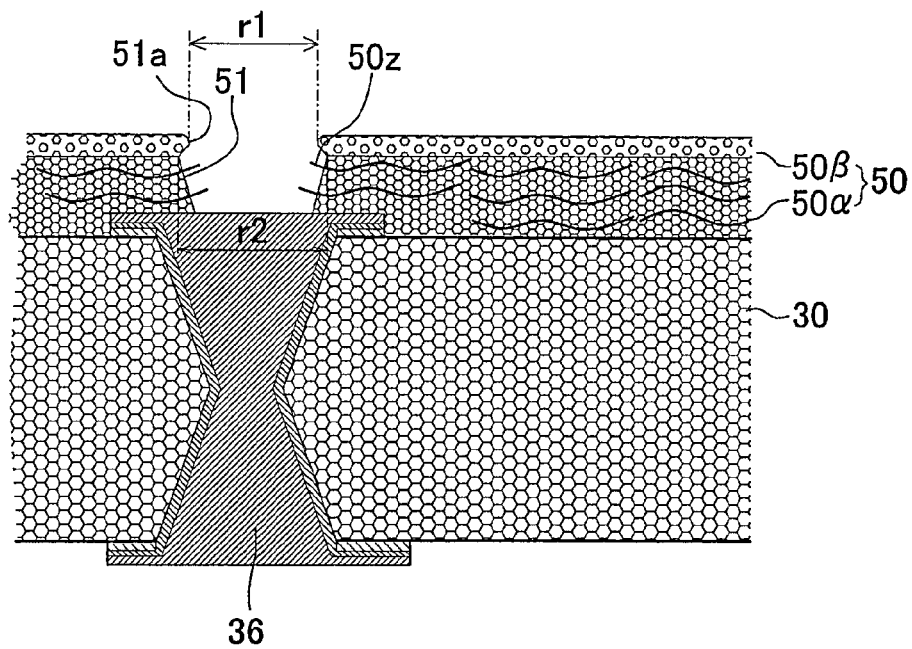
(B)
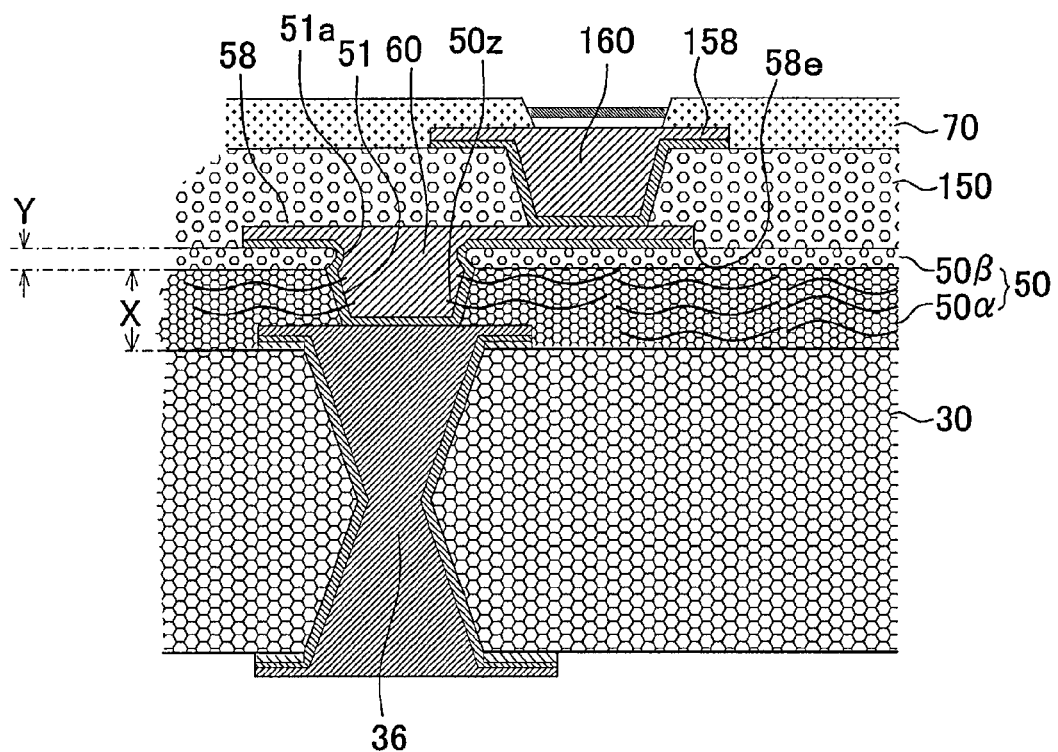

PRINTED WIRING BOARD AND METHOD FOR MANUFACTURING PRINTED WIRING BOARD

CROSS-REFERENCE TO RELATED APPLICATIONS

The present application is based upon and claims the benefit of priority from U.S. Application No. 61/581,321, filed Dec. 29, 2011, the entire contents of which are incorporated herein by reference.

BACKGROUND OF THE INVENTION

1. Field of the Invention

The present invention relates to a printed wiring board formed by alternately laminating conductive patterns and insulation layers on a core substrate, and to a method for manufacturing such a printed wiring board.

2. Description of Background Art

Japanese Laid-Open Patent Publication No. 2007-042666 describes a printed wiring board in which a buildup layer is formed by alternately laminating an interlayer resin insulation layer and a conductive pattern on a core substrate. In Japanese Laid-Open Patent Publication No. 2007-042666, wiring conductor is formed on an upper surface and a lower surface of the core substrate, and an insulation layer is formed to cover such wiring conductor. The insulation layer contains reinforcing material such as glass fiber. In addition, a thin protective layer is formed on a surface of the insulation layer. Wiring conductor is formed on the thin protective layer. Upper and lower wiring conductors are electrically connected by a via conductor that penetrates through the insulation layer and the thin protective layer. The entire contents of this publication are incorporated herein by reference

SUMMARY OF THE INVENTION

According to one aspect of the present invention, a printed wiring board includes a core substrate, a first conductive pattern formed on the core substrate, an insulation structure including a first insulation layer and formed on the core substrate such that the first insulation layer covers the first conductive pattern, a second conductive pattern formed on the insulation structure, and a second insulation layer formed on the insulation structure such that the second insulation layer covers the second conductive pattern. The insulation structure has a via conductor connecting the first conductive pattern and the second conductive pattern through the first insulation layer, the first insulation layer includes a first layer containing a reinforcing fiber material and a second layer formed on the first layer such that the first layer is positioned on the core substrate side and the second layer is positioned on the second insulation layer side, and the second layer of the first insulation layer is made of an insulating material which is the same material as an insulating material forming the second insulation layer.

According to another aspect of the present invention, a method for manufacturing a printed wiring board includes forming a first conductive pattern on a core substrate, forming on the core substrate an insulation structure including a first insulation layer such that the first insulation layer covers the first conductive pattern, forming a second conductive pattern on the insulation structure, and forming a second insulation layer on the insulation structure such that the second insulation layer covers the second conductive pattern. The forming of the insulation structure includes forming a first layer containing a reinforcing fiber material on the core substrate side and forming a second layer on the second insulation layer side such that the first layer and the second layer form the first insulation layer, and the second layer of the first insulation layer is made of an insulating material which is the same material as an insulating material forming the second insulation layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 5(A)-(C) are views showing steps of the method for manufacturing a printed wiring board according to the first embodiment;

FIG. 8(A) is a cross-sectional view of a first insulation layer with an opening, and FIG. 8(B) is a cross-sectional view of the first insulation layer with a via conductor.

DETAILED DESCRIPTION OF THE EMBODIMENTS

Figure 1:
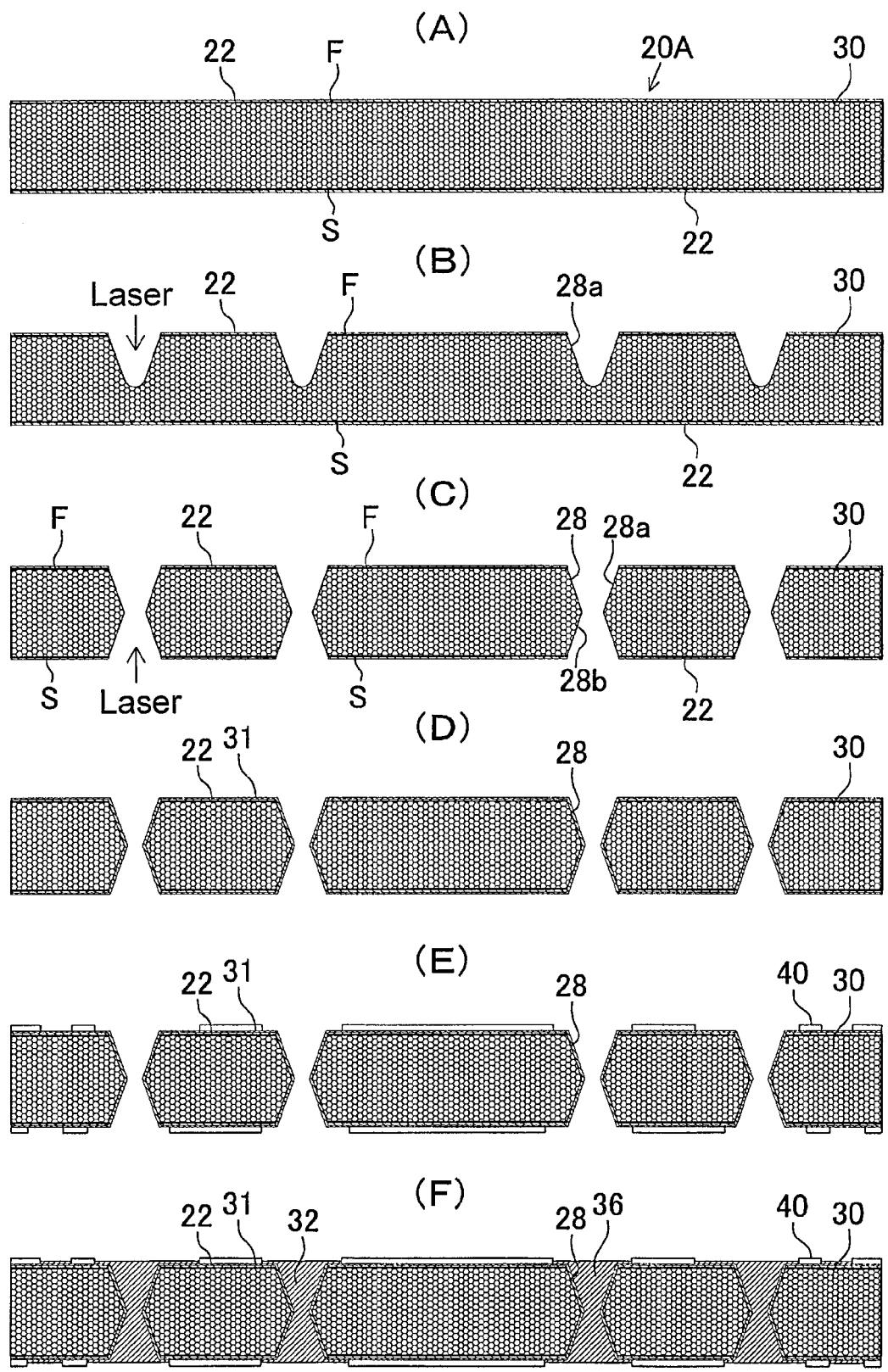
FIGS. 1(A)-(F) are views showing steps of a method for manufacturing a printed wiring board according to a first embodiment.
Figure 2:
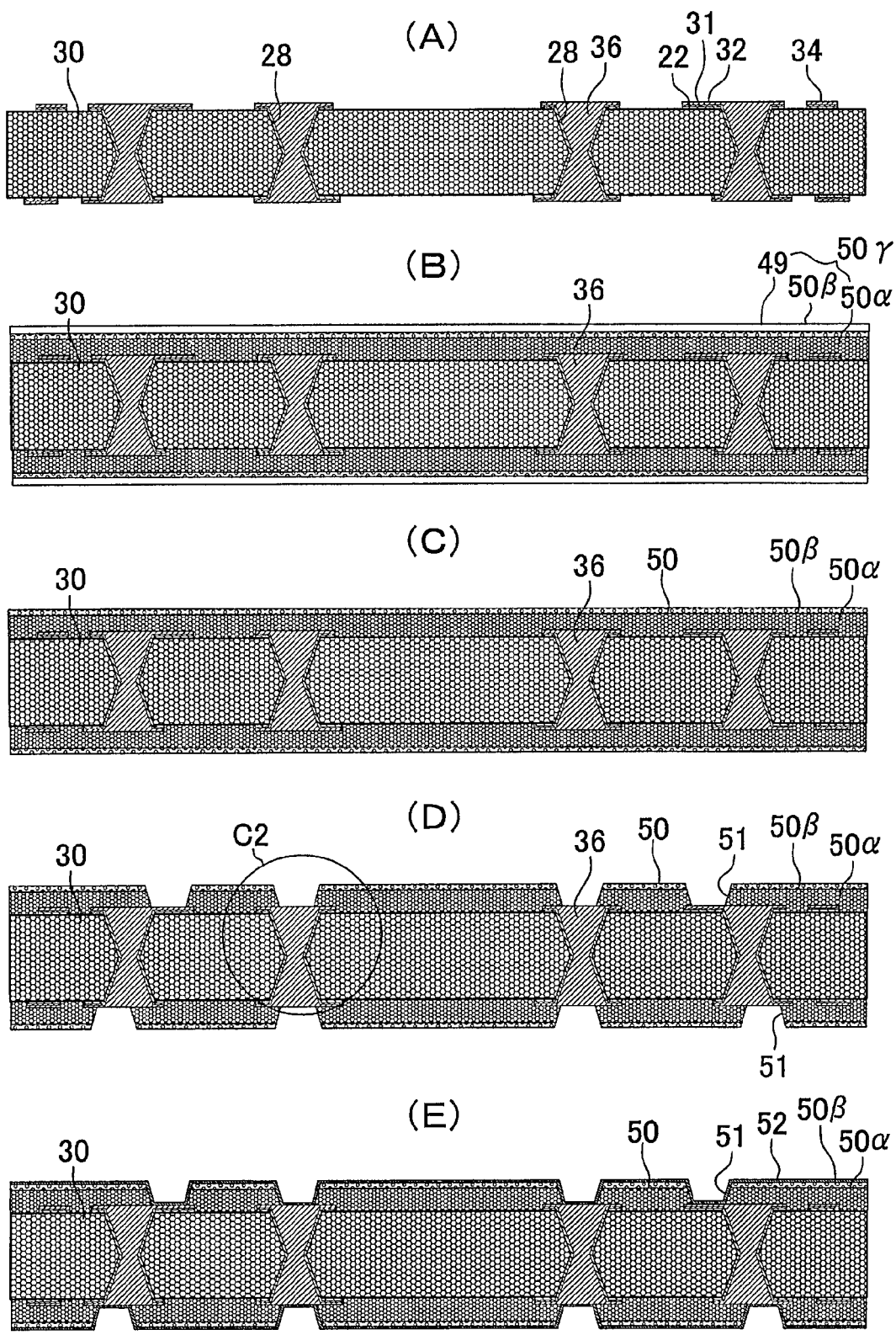
FIGS. 2(A)-(E) are views showing steps of the method for manufacturing a printed wiring board according to the first embodiment.
Figure 3:
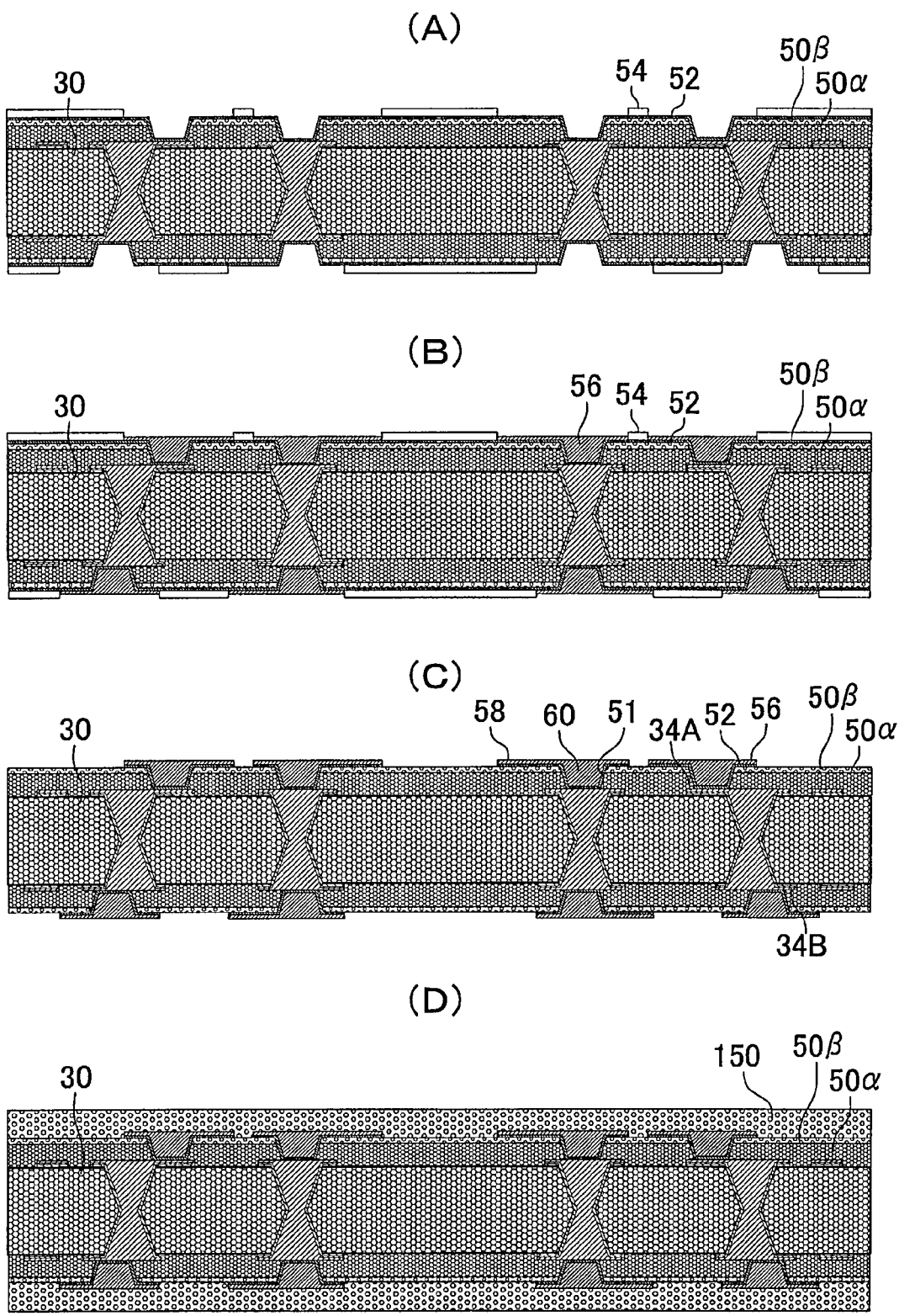
FIGS. 3(A)-(D) are views showing steps of the method for manufacturing a printed wiring board according to the first embodiment.
Figure 4:
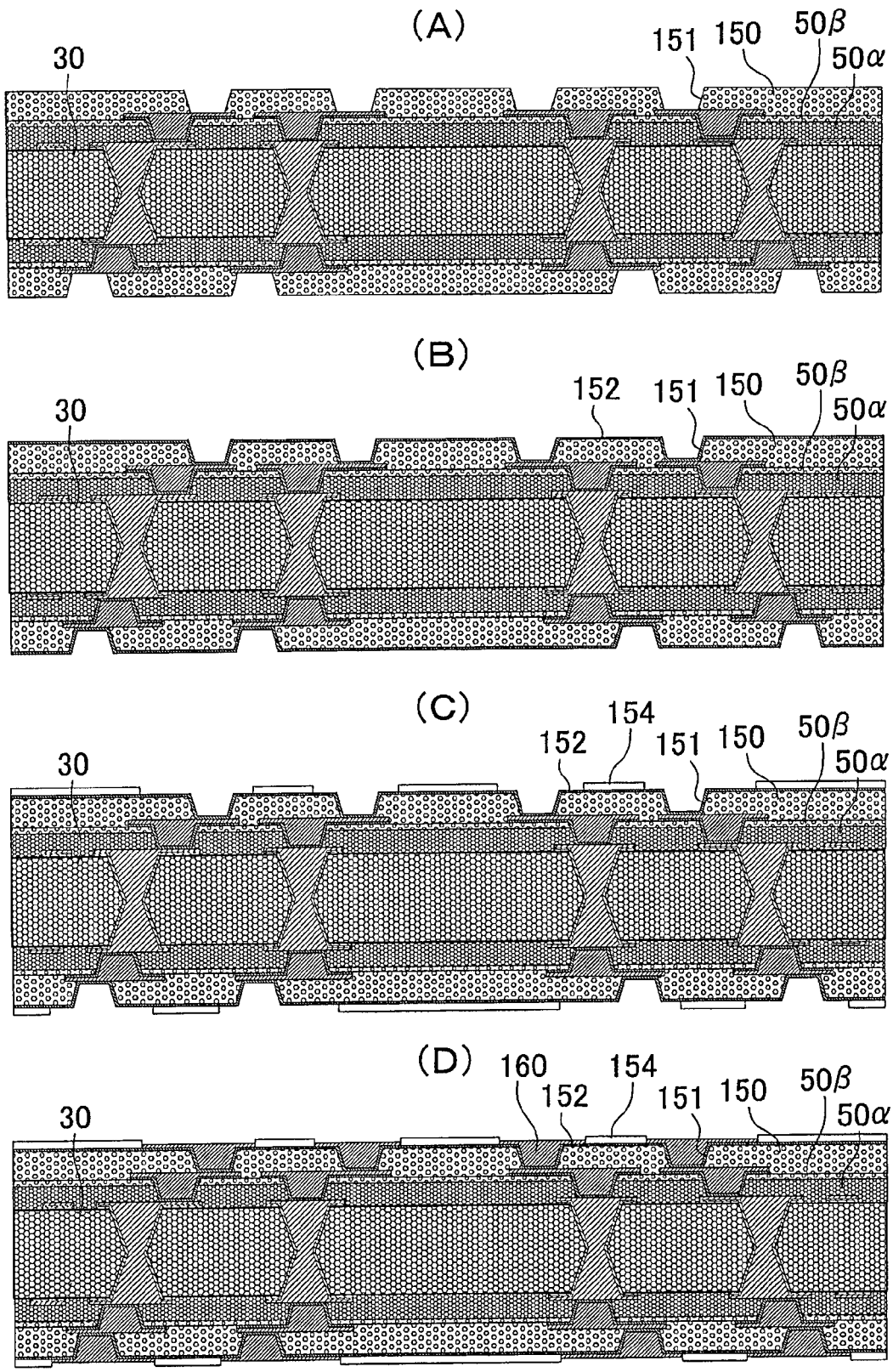
FIGS. 4(A)-(D) are views showing steps of the method for manufacturing a printed wiring board according to the first embodiment.

The embodiments will now be described with reference to the accompanying drawings, wherein like reference numerals designate corresponding or identical elements throughout the various drawings.

First Embodiment

Figure 6:
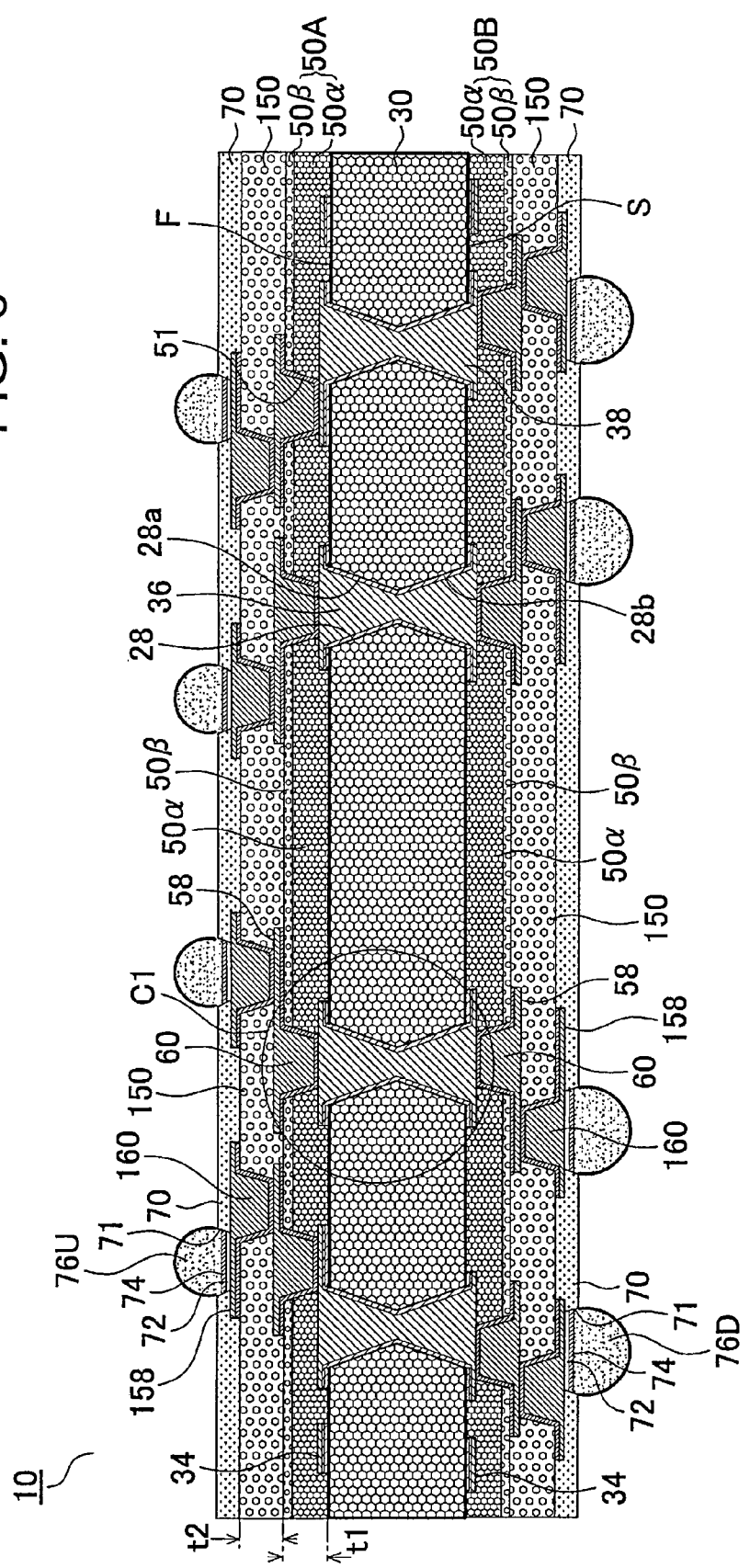
FIG. 6 is a cross-sectional view of a printed wiring board before an IC chip is mounted.
Figure 7:
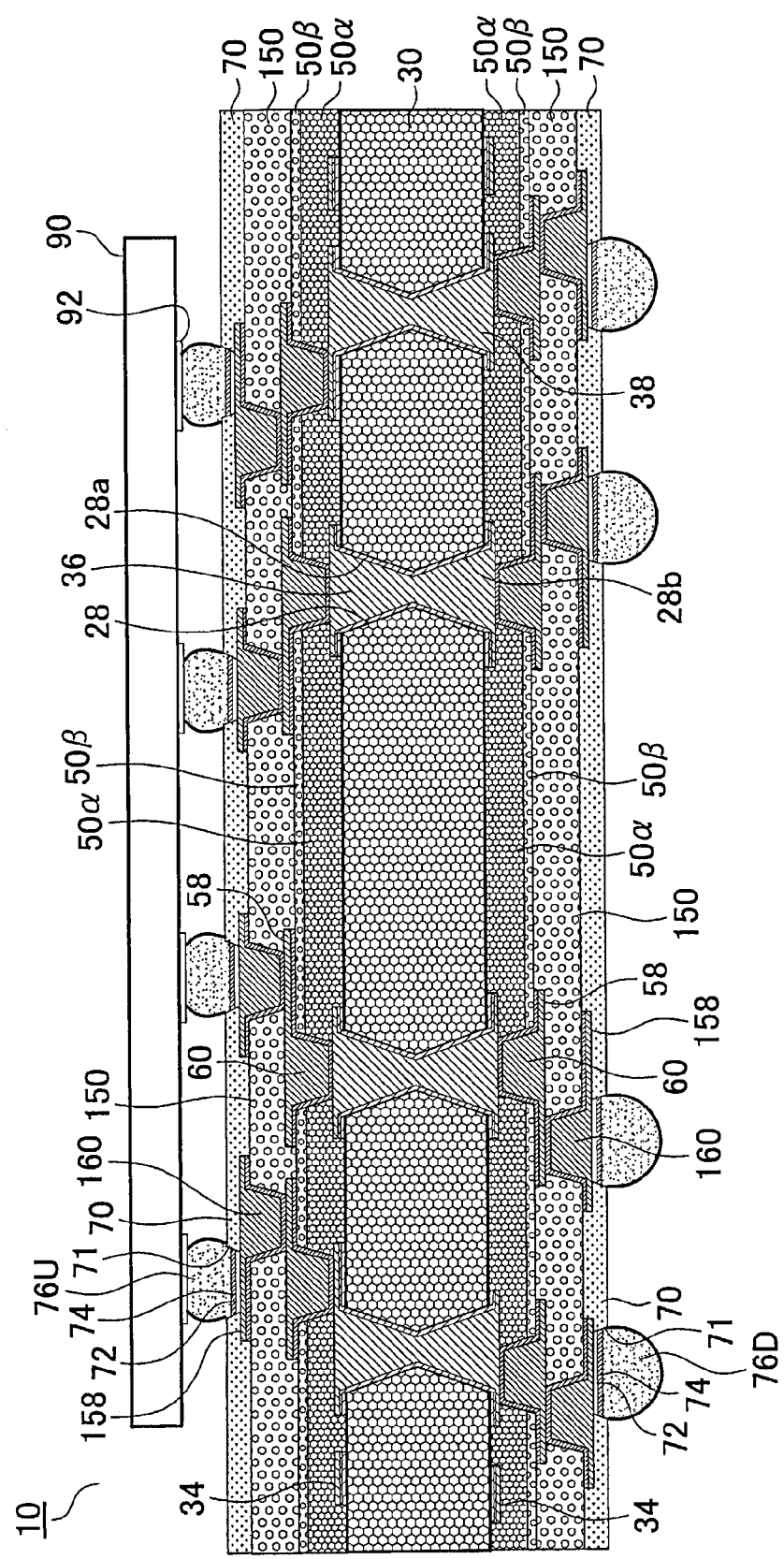
FIG. 7 is a cross-sectional view showing a state in which an IC chip is mounted on the printed wiring board shown in FIG. 6.

A printed wiring board according to a first embodiment of the present invention is described by referring to cross-sectional views in FIGS. 6 and 7. FIG. 6 shows printed wiring board 10. Printed wiring board 10 includes core substrate 30 which has first surface (F) and second surface (S) opposite first surface (F). To make printed wiring board 10 thinner, the thickness of core substrate 30 is preferred to be 400 μm or less, more preferably 200 μm or less. Core substrate 30 contains reinforcing fiber material such as glass cloth, glass non-woven fabric, aramid cloth or aramid non-woven fabric.

First conductive pattern (34A) is formed on first surface (F) of core substrate 30. First conductive pattern (34A) is made up of metal foil 22, electroless plated film 31 on metal film 22 and electrolytic plated film 32 on electroless plated film 31. The thickness of first conductive pattern (34A) is set greater than that of later-described second conductive pattern 58.

Meanwhile, first conductive pattern (34B) having the same structure is formed on second surface (S) of core substrate 30.

Penetrating hole 28 is formed in core substrate 30. Through-hole conductor 36 is formed by filling plating in penetrating hole 28. First conductive patterns (34A, 34B) on upper and lower surfaces of core substrate 30 are connected to each other by through-hole conductor 36. The diameter of through-hole conductor 36 (the maximum diameter around the opening portion) is preferred to be 100 μm or less.

First insulation layer 50 is formed on first surface (F) of core substrate 30 and first conductive pattern (34A). First insulation layer 50 has penetrating hole 51 which reaches first conductive pattern (34A). Second conductive pattern 58 is formed on first insulation layer 50. Via conductor 60 is formed by filling plating in penetrating hole 51. First conductive pattern (34A) and second conductive pattern 58 are connected by via conductor 60.

First insulation layer 50 includes first layer (50α) which is in contact with first surface (F) of core substrate 30 and insulates first conductive patterns (34A) adjacent to each other, and second layer (50β) which is formed on first layer (50α) and has a surface on which second conductive pattern 58 is formed.

First layer (50α) contains a reinforcing fiber material such as glass cloth, glass non-woven fabric, aramid cloth or aramid non-woven fabric. Accordingly, the rigidity of printed wiring board 10 is thought to be enhanced. As a result, if the thickness of core substrate 30 is 400 μm or less, for example, printed wiring board 10 is suppressed from warping.

In the present embodiment, using glass cloth is preferred from a viewpoint of burning resistance. As for glass cloth, woven fabric using E-glass, C-glass, D-glass, S-glass or the like, glass woven fabric made by bonding short fibers with organic binder, and blended fabric of glass fiber and cellulose fiber are listed. Glass woven fabric using E-glass is more preferable.

Moreover, the above-described glass cloth is preferred to be treated by an opening process to a high degree. As for such an opening process, a regular procedure is sufficient as long as the fiber is highly opened. For example, treatments such as opening by water flow, opening by high-frequency oscillation using a liquid as a medium, or processing using a roller to add pressure may be listed as ways to widen the fiber width so that gaps in woven-fabric substrates and glass woven fabrics are reduced. However, the treatment is not limited to any specific type.

Second layer (50β) is formed by adding a curing agent, curing accelerator, inorganic filler or the like to epoxy resin. As for epoxy resin, bisphenol A-type epoxy resin, bisphenol F-type epoxy rein, novolac epoxy resin or the like may be used. As for inorganic filler, silica, alumina, titanium oxide, zirconia or the like may be used.

Second layer (50β) is formed using a resin made by blending at least two types of resins, one that is relatively easy to dissolve in a solution used for a roughening treatment, and the other that is relatively hard to dissolve in such a solution. As for a resin that is relatively easy to dissolve in a solution for roughening treatment, thermoplastic resins such as polyethylene resin, polypropylene resin, polyester resin, polystyrene resin, acrylic resin, polyamide or polyethylene terephthalate may be used, for example. As for a resin that is relatively hard to dissolve in a solution for roughening treatment, the above-described epoxy resins may be used. When a roughening treatment is conducted, the resin that is relatively easy to dissolve in a solution for roughening treatment is dissolved, forming roughened shapes on a surface of second layer (50β).

Since second layer (50β) does not contain reinforcing fiber material, the roughened surface will not be made uneven by reinforcing fiber material exposed after the roughening treatment. As a result, forming fine conductive patterns is achieved using a semi-additive method, for example. Moreover, the reinforcing fiber material contained in first layer (50α) is suppressed from being exposed.

In the present embodiment, the amount of inorganic filler (silica) contained in first layer (50α) is approximately 60 wt. %, and the amount of inorganic filler (silica) contained in second layer (50β) is approximately 40 wt. %. Also, the linear expansion coefficient of first layer (50α) is 15~25 ppm, and the linear expansion coefficient of second layer (50β) is 30~40 ppm. Namely, the linear expansion coefficient of first layer (50α) is set smaller than the linear expansion coefficient of second layer (50β).

Then, when the thickness of first layer (50α) is set as X, and the thickness of second layer (50β) as Y, $0.05 \leq Y/X \leq 0.4$ is preferred to be satisfied. If (Y/X) is less than 0.05, the reinforcing fiber material contained in first layer (50α) may be exposed on a surface. On the other hand, if (Y/X) exceeds 0.4, the functional effect of first layer (50α) may not be achieved sufficiently, and the rigidity of printed wiring board 10 may not be secured. Namely, when $0.05 \leq Y/X \leq 0.4$ is satisfied, the surface of first insulation layer (50A) is evenly roughened, while the rigidity of printed wiring board 10 is easily secured.

As shown in FIG. 8(A), a side surface of second layer (50β) which forms part of the side wall of via-conductor opening 51 has protruding portion (51β) that protrudes toward the inside of the opening. Namely, opening diameter (r1) of opening 51 is not the maximum diameter, and is smaller than diameter (r2) measured at any spot in opening 51. Here, thermal stress generated when core substrate 30 or first insulation layer (50A) is deformed (thermal expansion or thermal contraction) usually tends to concentrate at the bottom portion of a via conductor. As a result, the via conductor may be delaminated, for example, or cracking may occur in the via conductor. However, since protruding portion (51a) is formed at an upper portion of opening 51 in the present embodiment, certain thermal stress will also be exerted on the via conductor through protruding portion (51a). Namely, thermal stress that tends to concentrate at the bottom portion of a via conductor is dispersed. As a result, connection reliability of the via conductor is secured while damage tends to be suppressed.

Also, part of reinforcing fiber material (50z) enters via conductor 60. Accordingly, the adhesiveness of via conductor 60 to first insulation layer 50 is strengthened because of reinforcing fiber material (50z). Then, via conductor 60 tends to follow the deformation of first insulation layer 50 through reinforcing fiber material (50z).

The roughness of second layer (50β) (arithmetic mean deviation of the profile (Ra)) is 0.3 μm or less. Accordingly, fine second conductive patterns are achieved while insulation between wiring lines is secured.

Also, the side wall of via-conductor opening 51 is roughened, and the roughness at the lower portion of the side wall is greater than that at the upper portion. Here "upper portion of the side wall" means the portion formed by second layer (50β). Accordingly, while adhesiveness of the portion where thermal stress tends to concentrate (lower portion of a via conductor) is sufficiently secured to first insulation layer 50, thermal stress generated on the upper portion of the via conductor is thought to be mitigated.

Second insulation layer 150 is formed on first insulation layer 50 and second conductive patterns. The thickness of second insulation layer 150 is 20~30 μm, which is thinner than the thickness of first insulation layer 50. Here, second insulation layer 150 is formed using the same material as that of above-described second layer (50β) of first insulation layer 50. "The same material" means the type and the amount of the contained organic ingredient and inorganic ingredient are substantially the same and physical properties of each ingredient are also substantially the same (if different, they should be within a tolerable error range).

Second insulation layer 150 includes opening 151 which reaches second conductive pattern 58. The surface of second insulation layer 150 including opening 151 is roughened. When such a roughening treatment is conducted, equipment such as a roughening bath and roughening conditions are not required to be modified significantly, since second insulation layer 150 is formed using the same material as that of the surface layer (second layer (50β) of first insulation layer 50. As a result, even if the first insulation layer is formed with multiple layers having different materials and physical properties, the subsequent procedure, namely, a step of treating the second insulation layer using a solution, is suppressed from being complex.

Also, there is a possibility that thermal stress generated in edge portion (58e) of second conductive pattern 58 (see FIG. 8(B)) is offset to a certain degree because the upper and lower insulation layers (second insulation layer, second layer) have substantially the same physical properties. Accordingly, cracking that originated at edge portion (58e) of second conductive pattern 58 is suppressed from spreading into insulation layers (50, 150).

As shown in FIG. 6, third conductive pattern 158 is formed on second insulation layer 150. Third conductive pattern 158 and second conductive pattern 58 are connected by via conductor 160. Solder-resist layer 70 is formed on second insulation layer 150 and third conductive pattern 158. Opening 71 to expose at least part of third conductive pattern 158 is formed in solder-resist layer 70. Solder bump (76U) is formed in opening 71.

Since the structure described above so far also applies to the second-surface (S) side of core substrate 30, its description is omitted.

Here, first layer (50α) and second layer (50β) of first insulation layer 50 are formed with different materials in the present embodiment. However, they may be formed using substantially the same material. In such a case as well, reinforcing fiber material is contained in first layer (50α) and reinforcing fiber material is not contained in second layer (50β).

By referring to FIGS. 1-6, a method is described in the following for manufacturing printed wiring board 10 described above with reference to FIGS. 6 and 7.

(1) A starting material is copper-clad laminate (20A) prepared by laminating copper foil 22 on both surfaces of core substrate 30 which is made of glass-epoxy resin or BT (bis-maleimide triazine) resin with an approximate thickness of 0.1 mm. First, a black-oxide treatment is performed on the surface of copper foil 22 using a solution containing NaOH (10 g/L), NaClO2 (40 g/L) and Na3PO4 (6 g/L) (FIG. 1(A)) as a blackening bath (oxidation bath).

(2) A CO2 laser is irradiated on the first-surface (F) (upper-surface) side of core substrate 30 from the first surface toward the second surface so that first opening portion (28a) to form a penetrating hole for a through hole is formed on the first-surface (F) (upper-surface) side of core substrate 30 (FIG. 1(B)). Here, first opening portion (28a) tapers from first surface (F) toward second surface (lower surface) (S).

(3) A CO2 laser is irradiated on the second-surface (S) (lower-surface) side of core substrate 30 from the second surface toward the first surface under the same conditions for forming first opening portion (28a) so that second opening portion (28b) is formed to be connected to first opening portion (28a). Accordingly, penetrating hole 28 is formed (FIG. 1(C)). Here, second opening portion (28b) tapers from second surface (S) toward first surface (F) (upper surface).

(4) Desmearing is performed on penetrating hole 28 using permanganic acid. Then, electroless plating is performed to form electroless plated film 31 (FIG. 1(D)).

(5) Plating resist 40 with a predetermined pattern is formed on electroless plated film 31 on surfaces of core substrate 30 (FIG. 1(E)).

(6) Electrolytic plating is performed to form electrolytic plated film 32 in portions without plating resist 40, and penetrating hole 28 is filled with plating to form through-hole conductor 36 (FIG. 1(F)).

(7) Plating resist 40 is removed, and electroless plated film 31 and copper foil 22 under the plating resist are etched away. Accordingly, first conductive pattern 34 is formed. Then, a conductive pattern on first surface (F) of core substrate 30 and a conductive pattern on second surface (S) are connected by through-hole conductor 36 (FIG. 2(A)). After that, the surface of first conductive pattern 34 is roughened.

(8) Resin sheet (50γ) is laminated on both surfaces of core substrate 30 after the above process (FIG. 2(B)). Resin sheet (50γ) is formed with first layer (50α), second layer (50β) on first layer (50α) and removable layer 49 on second layer (50β). The thickness of first layer (50α) is set greater than the thickness of second layer (50β).

(9) Then, removable layer 49 is removed, and first insulation layer 50 is formed by thermally curing first layer (50α) and second layer (50β) (FIG. 2(C)).

(10) Next, a CO2 gas laser, for example, is used to form opening portion 51 with an approximate diameter of 60 μm in first insulation layer 50 (FIG. 2(D)). The surface of first insulation layer 50 including opening portion 51 is roughened by immersing the substrate in an oxidation agent such as chromic acid or permanganate. During that time, a specific resin (a resin which is easy to dissolve by an oxidation agent) contained in second layer (50β) is dissolved, resulting in the roughened surface. The roughness (Ra) of the surface of first insulation layer 50 (surface of second layer (50β)) is 0.3 μm or less.

(11) A catalyst such as palladium is attached in advance to the surface of first insulation layer 50, and the substrate is immersed in an electroless plating solution for 5~60 minutes. Accordingly, electroless plated film 52 with an approximate thickness of 1 μm is formed (FIG. 2(E)).

(12) A commercially available photosensitive dry film is laminated on the substrate after the above treatment, and a photomask film is placed, exposed to light and developed using sodium carbonate so that plating resist 54 is formed (FIG. 3(A)).

(13) Next, electrolytic plating is performed to form electrolytic plated film 56 (FIG. 3(B)).

(14) After plating resist 54 is removed, electroless plated film 52 under the plating resist is dissolved and removed so that second conductive pattern 58, which is made of electroless plated film 52 and electrolytic plated film 56 and is approximately 15 μm thick, is formed (FIG. 3(C)). Second conductive pattern 58 is connected to first conductive pattern (34A) by via conductor 60. Then, the surface of second conductive pattern 58 is roughened.

(15) Next, resin film made of the same material as that of above-described second layer (50β) is laminated. Second insulation layer 150 is formed by thermally curing the resin film (FIG. 3(D)).

(16) A CO2 gas laser is used to form opening portion 151 with an approximate diameter of 60 μm in second insulation layer 150 (FIG. 4(A)). The substrate is immersed in an oxidation agent such as chromic acid or permanganate so that the surface of second insulation layer 150 including opening portion 151 is roughened. During that time, since second insulation layer 150 is formed using the same material as that of second layer (50β) which forms the surface layer of first insulation layer 50, the surface of second insulation layer 150 is roughened using the same equipment and under substantially the same conditions as those used when the surface of first insulation layer 50 is roughened. Namely, complex modifications are not required between the roughening process of first insulation layer 50 and the roughening process of second insulation layer 150. Accordingly, the manufacturing process is simplified.

(17) Taking the same steps as (11) to (14) above, third conductive pattern 158 is formed on second insulation layer 150, and third conductive pattern 158 and the second conductive pattern are connected by via conductor 160 (FIGS. 4(B)~5(A)).

(18) A commercially available solder-resist composition is applied, exposed to light and developed so that solder-resist layer 70 with opening 71 is formed (FIG. 5(B)).

(19) The substrate is immersed in an electroless nickel-plating solution so that nickel-plated layer 72 is formed in opening portion 71. Moreover, the substrate is immersed in an electroless gold-plating solution so that gold-plated layer 74 is formed on nickel-plated layer 72 (FIG. 5(C)). Instead of nickel-gold layers, nickel-palladium-gold layers may also be formed.

(20) Then, a solder ball is loaded in opening portion 71 and a reflow is conducted. Accordingly, solder bump (76U) is formed on the first-surface (upper-surface) side and solder bump (76D) is formed on the second-surface (lower-surface) side. Printed wiring board 10 is completed (FIG. 6).

IC chip 90 is mounted on printed wiring board 10 by connecting pad 92 of IC chip 90 to solder bump (76U) (FIG. 7).

Second Embodiment

Figure 9:
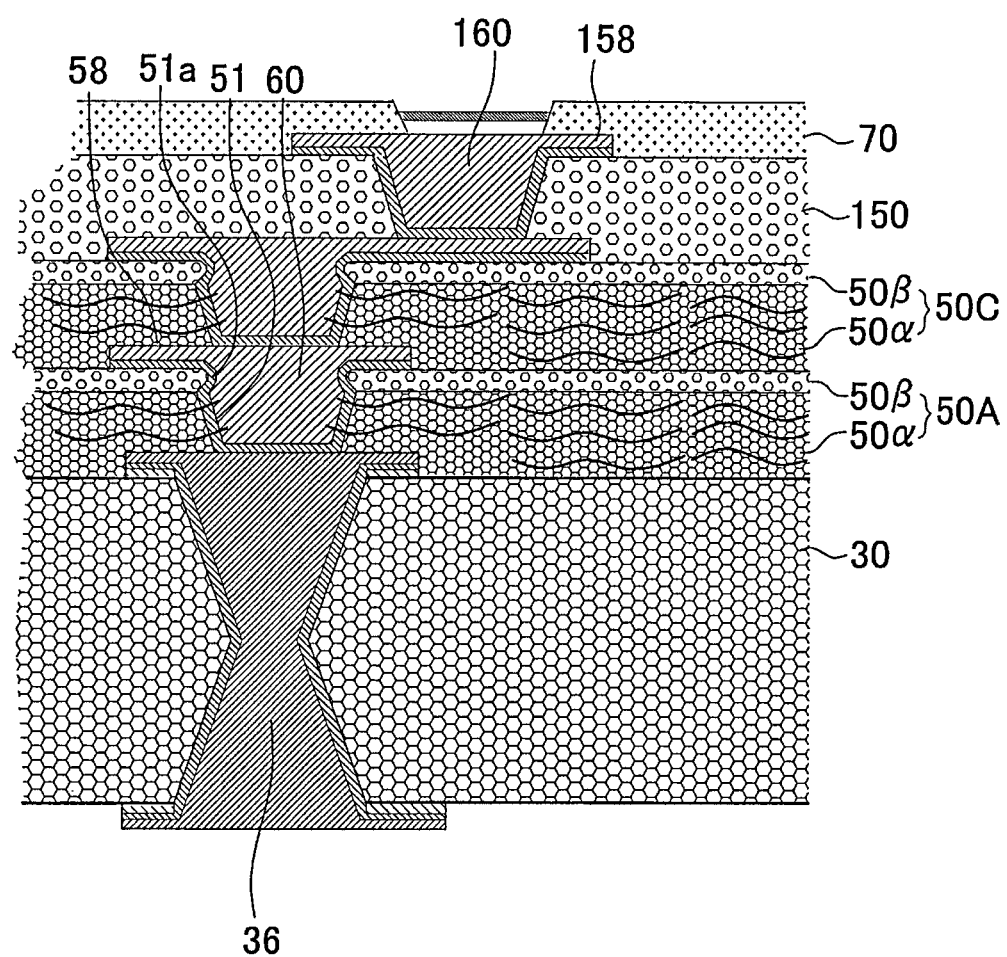
FIG. 9 is a cross-sectional view of a first insulation layer according to a second embodiment.

In the above first embodiment, there is one layer of first insulation layer (50A) that contains reinforcing fiber material. However, the number of layers is not limited specifically. Namely, as shown in FIG. 9, two first insulation layers (50A, 50C) may be formed. By doing so, printed wiring board 10 tends to be suppressed from warping.

A printed wiring board according to an embodiment of the present invention has the following technological features: a core substrate having a first surface and a second surface opposite the first surface; a first conductive pattern formed on the core substrate; a first insulation layer formed on the first surface of the core substrate to cover the first conductive pattern and having an opening for a via conductor; a second conductive pattern formed on the first insulation layer; a via conductor formed in the opening and connecting the first conductive pattern and the second conductive pattern; and a second insulation layer formed on the first insulation layer to cover the second conductive pattern. In such a printed wiring board, the first insulation layer is formed with a first layer containing a reinforcing fiber material positioned on the first-surface side of the core substrate and with a second layer formed on the first layer, and the second layer is made of the same material as that of the second insulation layer.

The technological features of a method for manufacturing a printed wiring board according to another embodiment of the present invention includes the following: preparing a core substrate having a first surface and a second surface opposite the first surface; forming a first conductive pattern on the core substrate; forming a first insulation layer on the first surface of the core substrate to cover the first conductive pattern; forming a second conductive pattern on the first insulation layer; and forming a second insulation layer on the first insulation layer to cover the second conductive pattern. In such a manufacturing method, the first insulation layer is formed with a first layer containing a reinforcing fiber material positioned on the first-surface side of the core substrate and with a second layer formed on the first layer, and the second layer is made of the same material as that of the second insulation layer.

In the printed wiring board and its manufacturing method according to embodiments of the present invention, a surface portion (second layer) of a first insulation layer containing a reinforcing fiber material and a second insulation layer positioned as its upper layer are formed using the same material. Therefore, the conditions for roughening a surface of the second insulation layer are not required to be significantly different from the conditions for roughening a surface of the first insulation layer, for example, allowing the same equipment to be used. As a result, it is thought that manufacturing steps are suppressed from becoming complex.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
a core substrate;
a first conductive pattern formed on the core substrate;
an insulation structure comprising a first insulation layer and formed on the core substrate such that the first insulation layer covers the first conductive pattern;
a second conductive pattern formed on the insulation structure; and
a second insulation layer formed on the insulation structure such that the second insulation layer covers the second conductive pattern,
wherein the core substrate has a through hole conductor formed through the core substrate such that the through hole conductor is connected to the first conductive pattern, the insulation structure has a via conductor formed on the through hole conductor and connecting the first conductive pattern and the second conductive pattern through the first insulation layer, the first insulation layer includes a first layer comprising a reinforcing fiber material and a second layer formed on the first layer such that the first layer is positioned on a core substrate side and the second layer is positioned on a second insulation layer side, the reinforcing fiber material in the first layer of the first insulation layer includes a portion penetrating into the via conductor, and the second layer of the first insulation layer is made of an insulating material which is a same material as an insulating material forming the second insulation layer.

2. The printed wiring board according to claim 1, wherein the insulating material of the second insulation layer does not contain a reinforcing fiber material.

3. The printed wiring board according to claim 1, wherein the first layer of the first insulation layer has a linear expansion coefficient which is set smaller than a linear expansion coefficient of the second layer of the first insulation layer.

4. The printed wiring board according to claim 1, wherein the first layer of the first insulation layer has a thickness which is set greater than a thickness of the second layer of the first insulation layer.

5. The printed wiring board according to claim 1, wherein the first layer of the first insulation layer and the second layer of the first insulation layer satisfy a relationship, $0.05 \leq Y/X \leq 0.4$, where X represents a thickness of the first layer of the first insulation layer and Y represents a thickness of the second layer of the first insulation layer.

6. The printed wiring board according to claim 1, wherein the first insulation layer has a protruding portion protruding into the via conductor.

7. The printed wiring board according to claim 1, wherein the first insulation layer has an opening portion in which the via conductor is formed, and the opening portion in the first insulation layer has a roughened side wall whose roughness in a lower portion of the side wall corresponding to the first layer is greater than a roughness in an upper portion of the side wall corresponding to the second layer.

8. The printed wiring board according to claim 1, wherein the second layer of the first insulation layer is made of a resin material comprising a resin which is relatively easy to dissolve in a solution for roughening treatment and a resin which is relatively hard to dissolve in the solution for roughening treatment.

9. The printed wiring board according to claim 1, wherein the first insulation layer includes an inorganic filler such that the first layer of the first insulation layer includes the inorganic filler in an amount which is set greater than an amount of the inorganic filler in the second layer.

10. The printed wiring board according to claim 1, wherein the insulation structure has a plurality of insulation layers including the first insulation layer, and each of the plurality of insulation layers in the insulation structure has a via conductor forming a via connection structure connecting the first conductive pattern and the second conductive pattern through the insulation structure and includes a first layer comprising a reinforcing fiber material and a second layer formed on the first layer such that the first layer is positioned on the core substrate side and the second layer is positioned on the second insulation layer side and that the second layer is made of an insulating material which is the same material as the insulating material forming the second insulation layer.

11. The printed wiring board according to claim 1, wherein the insulation structure has a plurality of insulation layers including the first insulation layer.

12. The printed wiring board according to claim 1, further comprising a laminated structure formed on the core substrate on an opposite side with respect to the first conductive pattern and comprising a conductive pattern and an insulation layer.

13. The printed wiring board according to claim 1, further comprising a laminated structure formed on the core substrate on an opposite side with respect to the first conductive pattern and comprising a conductive pattern and an insulation layer, wherein the core substrate has the through hole conductor formed through the core substrate such that the through hole conductor is connecting the first conductive pattern and the conductive pattern in the laminated structure.

14. The printed wiring board according to claim 1, further comprising a conductive pattern formed on the core substrate on an opposite side with respect to the first conductive pattern, wherein the core substrate has the through hole conductor formed through the core substrate such that the through hole conductor is connecting the first conductive pattern and the conductive pattern on the core substrate on the opposite side.

15. The printed wiring board according to claim 1, wherein the insulating material of the second insulation layer is a resin material comprising a thermoplastic resin and an epoxy resin.

16. The printed wiring board according to claim 2, wherein the first layer of the first insulation layer has a thickness which is set greater than a thickness of the second layer of the first insulation layer.

17. A method for manufacturing a printed wiring board, comprising:
    forming a through hole conductor through a core substrate;
    forming a first conductive pattern on the core substrate such that the through hole conductor is connected to the first conductive pattern;
    forming on the core substrate an insulation structure comprising a first insulation layer such that the first insulation layer covers the first conductive pattern;
    forming a second conductive pattern on the insulation structure;
    forming an opening portion through the first insulation layer such that the opening portion is formed on the through hole conductor;
    forming a via conductor in the opening portion such that the via conductor is formed on the through hole conductor and that the first conductive pattern and the second conductive pattern are connected through the via conductor; and
    forming a second insulation layer on the insulation structure such that the second insulation layer covers the second conductive pattern,
    wherein the forming of the insulation structure comprises forming a first layer comprising a reinforcing fiber material on a core substrate side and forming a second layer on a second insulation layer side such that the first layer and the second layer form the first insulation layer, the forming of the via conductor comprises forming the via conductor such that the reinforcing fiber material in the first layer of the first insulation layer includes a portion penetrating into the via conductor, and the second layer of the first insulation layer is made of an insulating material which is a same material as an insulating material forming the second insulation layer.

18. The method for manufacturing a printed wiring board according to claim 17, further comprising:
    roughening a side wall in the opening portion of the first insulation layer.

19. The method for manufacturing a printed wiring board according to claim 17, further comprising:
    roughening a surface of the first insulation layer prior to the forming of the second insulation layer; and
    roughening a surface of the second insulation layer,
    wherein the roughening of the surface of the first insulation layer and the roughening of the surface of the second insulation layer are conducted under substantially same roughening treatment conditions.

20. The method for manufacturing a printed wiring board according to claim 17, wherein the insulating material of the second insulation layer does not contain a reinforcing fiber material.

* * * * *